United States Patent [19]
Langley

[11] Patent Number: 5,686,762
[45] Date of Patent: Nov. 11, 1997

[54] SEMICONDUCTOR DEVICE WITH IMPROVED BOND PADS

[75] Inventor: Rodney C. Langley, Boise, Id.

[73] Assignee: Micron Technology, Inc., Boise, Id.

[21] Appl. No.: 577,911

[22] Filed: Dec. 21, 1995

[51] Int. Cl.⁶ .................................................. H01L 23/48
[52] U.S. Cl. .......................... 257/775; 257/784; 257/786
[58] Field of Search .................................. 257/786, 760, 257/775, 784, 766, 780

[56]  References Cited

U.S. PATENT DOCUMENTS

| | | | |
|---|---|---|---|
| 5,053,850 | 10/1991 | Baker et al. | 257/786 |
| 5,248,903 | 9/1993 | Heim | 257/780 |
| 5,373,111 | 12/1994 | McClure et al. | 174/250 |

FOREIGN PATENT DOCUMENTS

| | | | |
|---|---|---|---|
| 63-161634 | 7/1988 | Japan | 257/786 |
| 6-37135 | 2/1994 | Japan | 257/786 |

Primary Examiner—Tom Thomas
Assistant Examiner—Roy Potter
Attorney, Agent, or Firm—Ormiston Korfanta Dunbar & Holland

[57]   ABSTRACT

A semiconductor device with improved bond pads. The semiconductor device includes bond pads electrically connected to an active circuit in the device and openings formed in the bonding surface of the bond pads. The opening(s) may include recesses extending partially into the bonding surface or channels that extend entirely through the bond pads. Various shapes and configurations of the openings may be used, such as a pattern of channels radiating from the center of the bonding surface, a series of spaced apart rectangular channels arranged parallel to one another, an array of L shaped channels arranged around the center of the bonding surface, or an array of holes.

16 Claims, 5 Drawing Sheets

SEMICONDUCTOR DEVICE WITH IMPROVED BOND PADS

FIELD OF THE INVENTION

The invention relates to semiconductor devices having bond pads for connection to an external circuit and, more particularly, to an improved bond bad having openings in the bonding surface of the bond pad.

BACKGROUND OF THE INVENTION

Many semiconductor devices utilize bond pads as the terminals for electrically connecting active circuits in the device to an external circuit. The bond pads are select areas of the interconnect wiring pattern left exposed after formation of the passivation layer which covers the semiconductor die. The active circuits in the die are connected to the interconnect wiring and accessed through the bond pads. Thin wires are bonded to the bond pads. These bond wires electrically connect the bond pads to metal leads which, after the die/lead assembly has been enclosed within a sealed package, are inserted into or otherwise attached to a printed circuit board.

During the wire bonding process, a heat block heats the die and the leads to a temperature of about 150° C. to 350° C. The end of the bond wire is heated by an electrical discharge or a hydrogen torch to a molten state, thus forming a ball of molten metal on the end of the bond wire. The molten ball is pressed by a bonding capillary tool against the heated bond pad, sometimes in combination with ultrasonic vibration, to alloy the metallic elements of the wire and the metal bond pad and thereby bond the wire to the pad. The bonding capillary tool is then moved to a bonding site on the appropriate lead. The wire is pressed against the heated lead to bond the wire to the lead. The bond wire is then tensioned and sheared. The process is repeated for each bond pad on the die.

The bonding surface of conventional bond pads is substantially flat. The present invention is directed in general to an improved bond pad and, more specifically, to a bond pad having openings formed in the bonding surface of the bond pad. It is believed that forming openings in the bonding surface of the bond pad may, in some instances, improve the strength of the wire bond.

SUMMARY OF THE INVENTION

Accordingly, it is one object of the invention to improve the strength of the bond between the bond wire and the bond pad formed during the fabrication of semiconductor devices.

It is another object of the invention to increase the surface area of the bond pad without also increasing the size of the bond pad.

According to the present invention, these and other objects are achieved by a semiconductor device that includes a bond pad electrically connected to an active circuit in the semiconductor device and at least one opening formed in the bonding surface of the bond pad. The opening(s) may include recesses extending partially into the bonding surface or channels that extend entirely through the bond pad. Various shapes and configurations of the openings may be used and tailored to specific device requirements. For example, the openings may be a pattern of rectangular channels disposed about the center of the bonding surface or an array of holes.

Additional objects, advantages and novel features of the invention will be set forth in part in the description that follows, and in part will become apparent to those skilled in the art upon examination of the following or may be learned by practice of the invention.

DETAILED DESCRIPTION OF THE INVENTION

Figure 1:
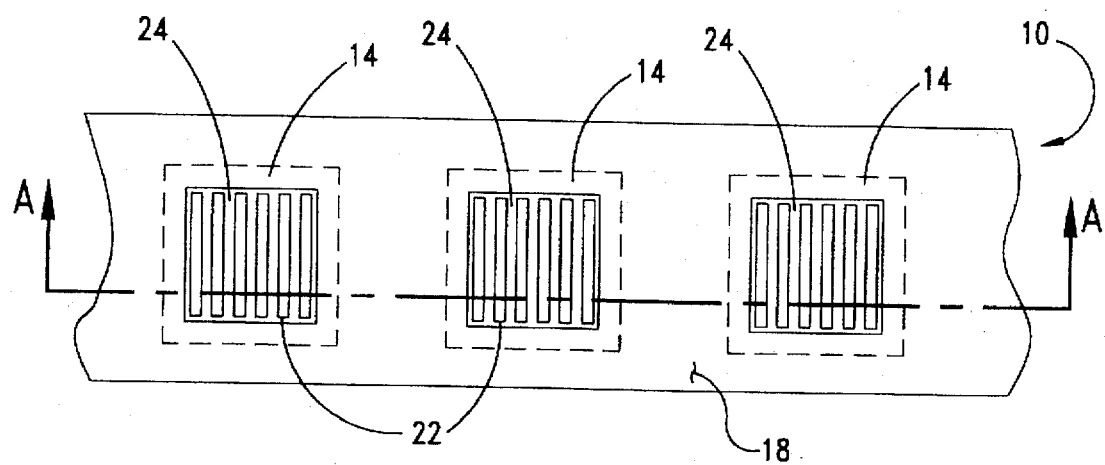
FIG. 1 is a top down plan view of a bond pad having a series of rectangular channels arranged parallel to one another.
Figure 2:
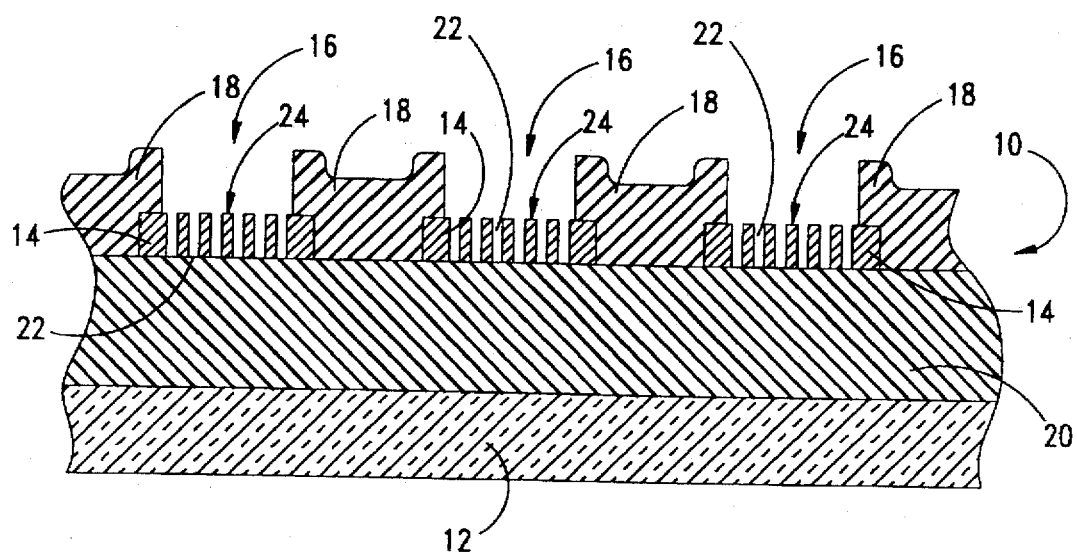
FIG. 2 is a cross section view taken along the line A—A in FIG. 1 wherein the openings extend through the bond pad.

FIGS. 1 and 2 are a top down plan view and a cross section view, respectively, of one of the preferred embodiments of the present invention. Referring to FIGS. 1 and 2, semiconductor device 10 can be any integrated circuit device, such as a random access memory (RAM), a programmable read only memory (PROM), a logic circuit or any type of application specific integrated circuit device. The active circuits (not shown), which are formed in a main region 12 of the semiconductor device 10, are electrically connected to bond pads 14. Bond pads 14 constitute select areas of a wiring pattern exposed through holes 16 in passivation layer 18. The wiring pattern and, correspondingly, bond pads 14 are formed on thick insulating layer 20. Openings 22 are formed in the bonding surface 24 of bond pads 14.

Figure 3:
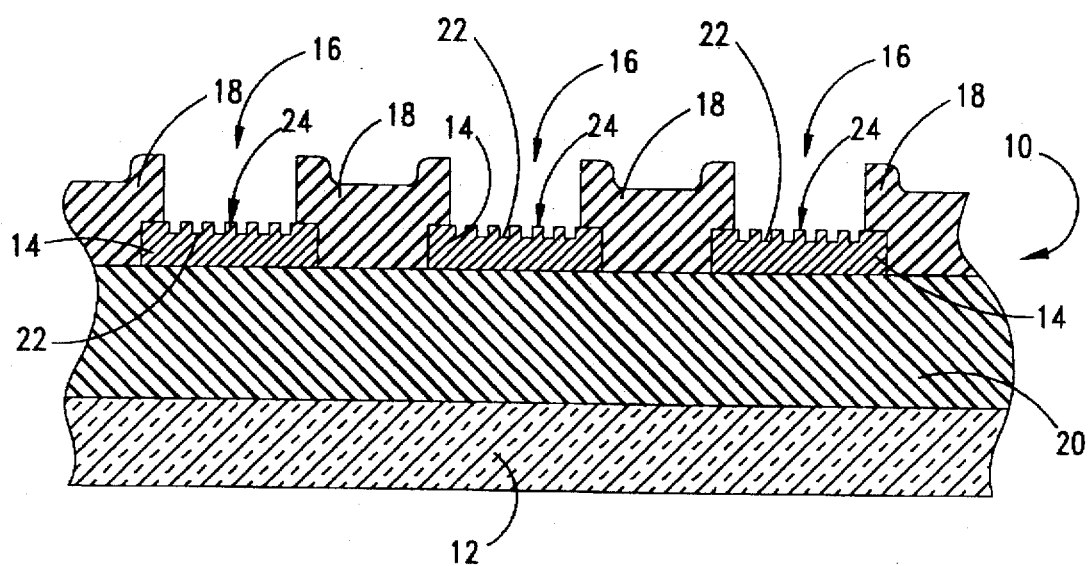
FIG. 3 is a cross section view taken along the line A—A in FIG. 1 wherein the openings extend only partially into the bond pad.
Figure 4:
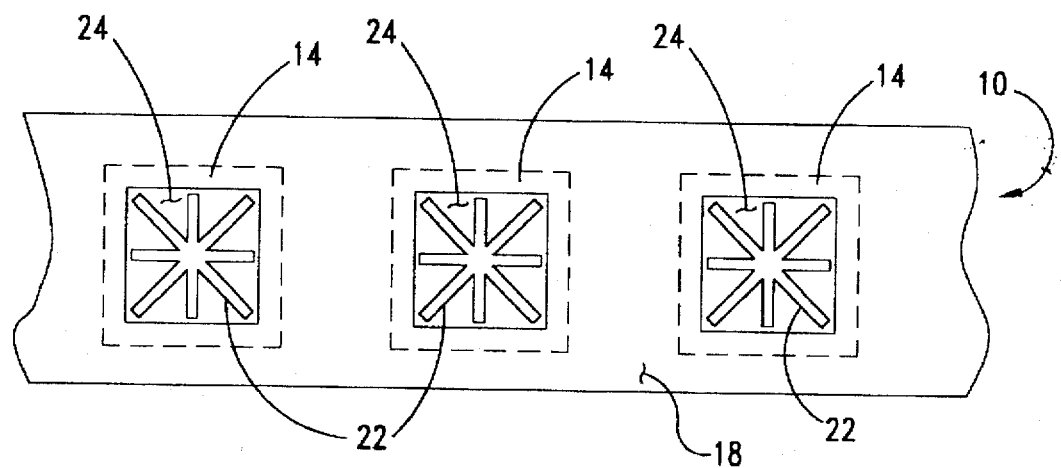
FIG. 4–6 are top down plan views of alternative embodiments of the invented bond pad having various configurations of openings.
Figure 5:
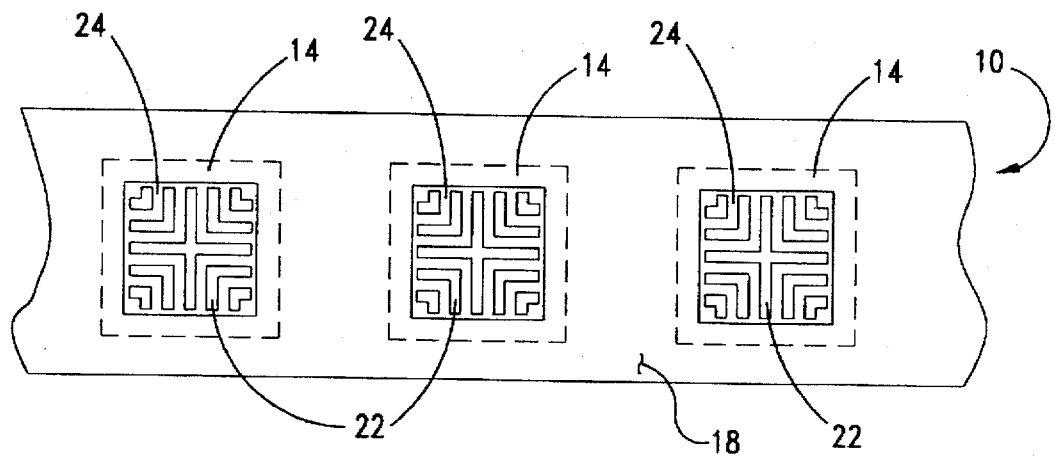
Figure 6:
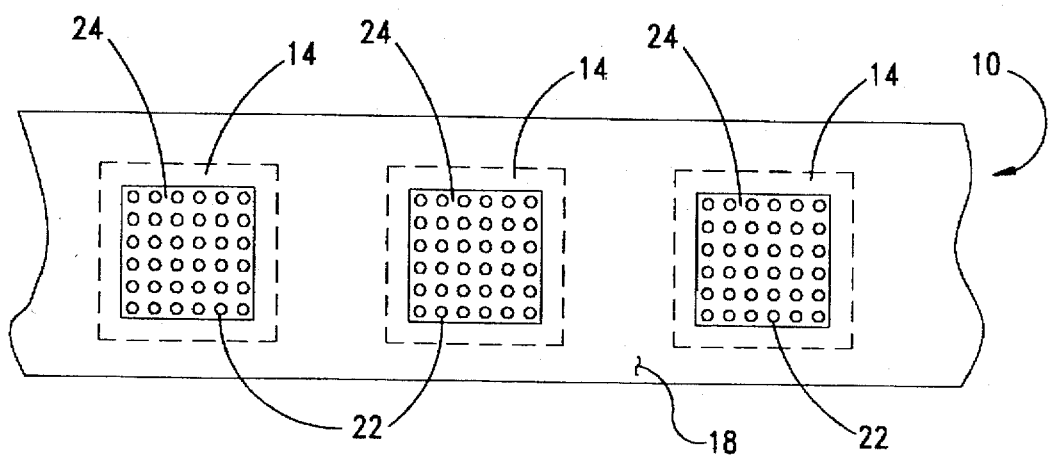

Preferably, openings 22 extend through bond pads 14, as shown in FIG. 1. Alternatively, openings 22 may be recesses that extend only partially into bonding surface 24, as shown in FIG. 3. Openings 22 comprise a series rectangular channels arranged parallel to one another as shown in FIG. 1. Other shapes and configurations may also be used and tailored to specific device requirements. For example, openings 22 may comprise a pattern of radiating channels disposed about the center of bonding surface 24 as illustrated in FIGS. 4, an array of L shaped channels as shown in FIG. 5, or an array of holes as shown in FIG. 6. To facilitate probing and testing, the center portion of bonding surface 24 may be left free of openings.

The openings are believed to promote a more robust bond by increasing the surface area available for bonding, but without increasing the size of the bond pad. In addition, it is believed that the sidewalls of openings 22 collapse during the bonding process, thereby further increasing bond strength.

Figure 7:
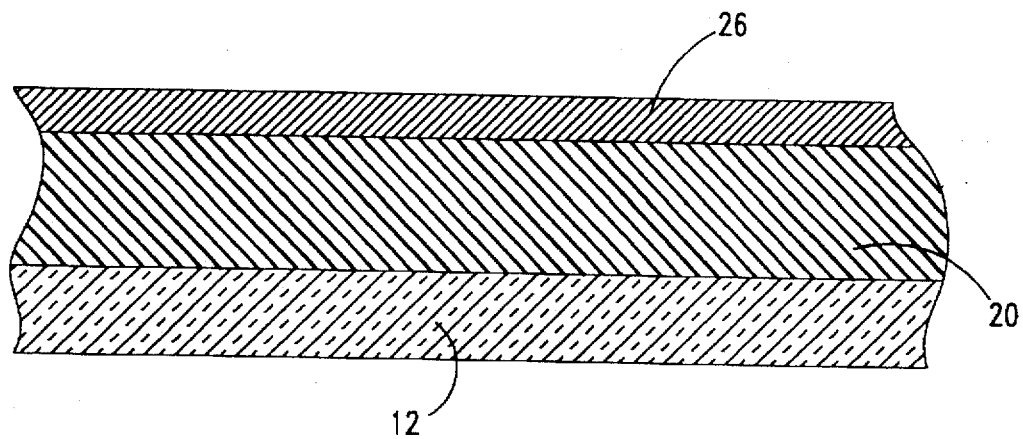
FIGS 7–9 are cross section views of the device of FIG. 1 at various stages of fabrication.

The formation of semiconductor device 10 will now be described with reference to FIGS. 7–9. Semiconductor device 10 is formed using conventional fabrication processes and materials well known in the art, including etching predetermined patterns into the various layers of material. Such etching is referred to herein for convenience as "patterning and etching." Photolithography and reactive ion etching, for example, are commonly used pattern and etch processes. These or other pattern and etch processes, well known to those skilled in the art, may be used to implement the present invention. Referring first to FIG. 7, active circuits (not shown) are formed in a main region 12 of semiconductor device 10. Thick insulating layer 20, typically made of phosphosilicate glass, is formed over the active circuits and usually extends into the periphery to cover the entire upper surface of the device. Insulating layer 20 is patterned and etched, and this etch may continue down through inferior layers of material, to open contact vias (not shown) to the active circuits. A layer of metal 26, typically aluminum, is deposited over insulating layer 20 and into the contact vias.

Figure 8:
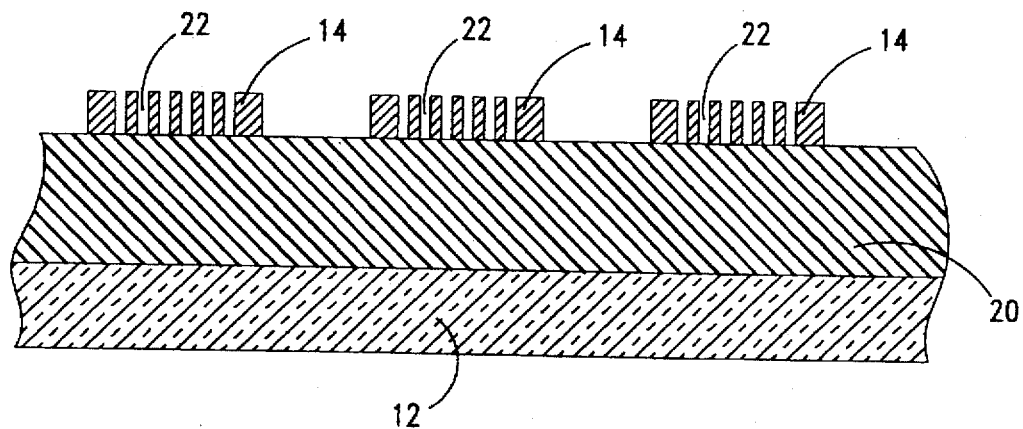
Figure 9:
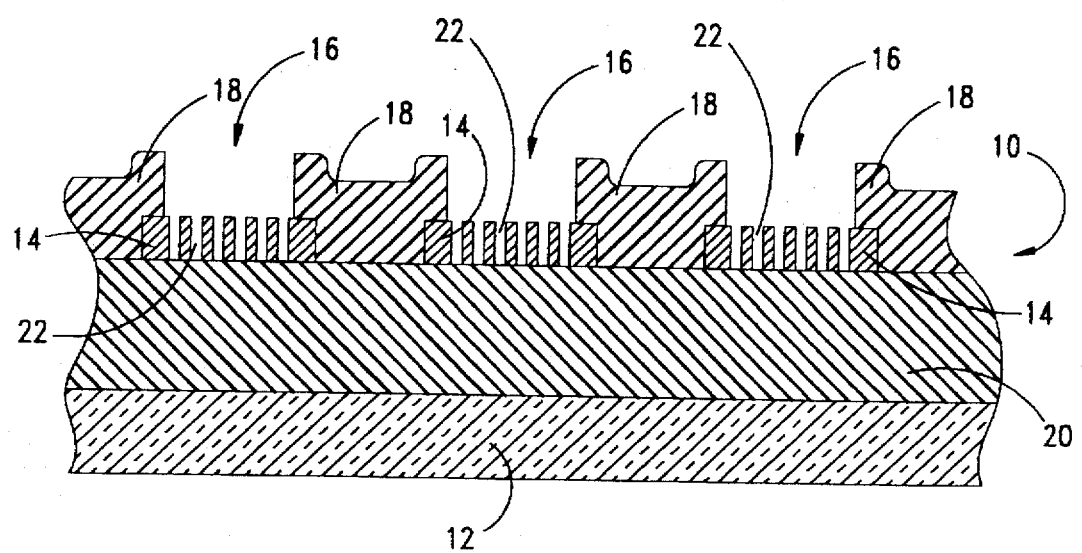

Referring now to FIG. 8, metal layer 26 is patterned and etched to form an interconnect wiring pattern. Preferably during this same pattern and etch step, openings 22 are formed in select areas of the wiring pattern at the desired locations of the bond pads 14. Referring to FIG. 9, passivation layer 18, typically made of phosphosilicate glass or silicon nitride, is then deposited over the entire surface of the device and patterned and etched to form holes 16 and thereby expose the select areas of the wiring pattern in which openings 22 were previously formed. Those areas of the wiring pattern exposed through holes 16 in passivation layer 18 constitute bond pads 14. For those embodiments of the invention wherein openings 22 extend through bond pads 14, a portion of the material comprising passivation 18 will typically be left in the bottom of the openings 22. If, and to what extent, such material remains in openings 22 will depend on the duration and selectivity of the passivation layer etch.

Figure 10:
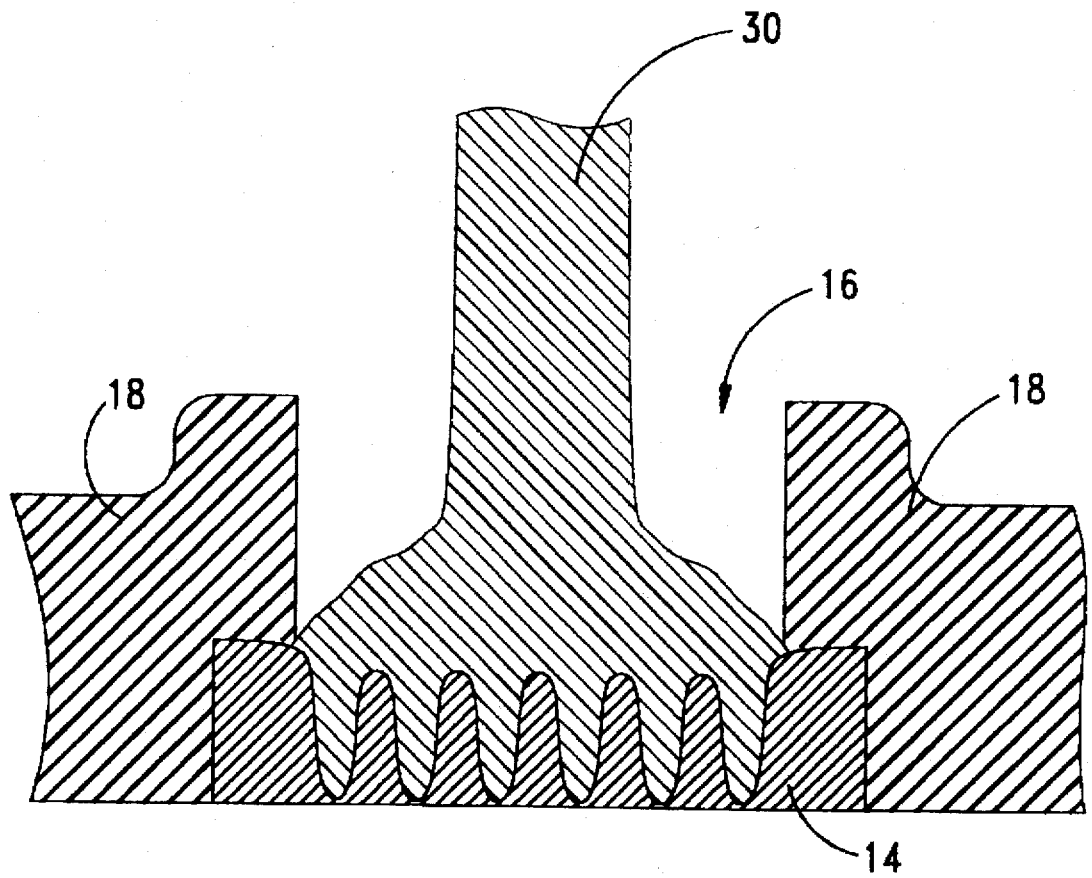
FIG. 10 is an expanded view of the bond between a bond wire and the bond pad of FIG. 1.

Referring to FIG. 10, bond wire 30 is bonded to bond pad 14. Bond wire 30 serves as an electrode for connection to an external circuit. As is known in the art, this wire bond connection is made by forming a molten ball on the end of bond wire 30 and pressing the molten ball against bond pad 14, which has been heated to a temperature 150° C. and 350° C., in the presence of ultrasonic vibration to alloy the metallic elements of bond wire 30 and bond pad 14. It is believed that the bonding process causes the sidewalls of openings 22 to collapse resulting in the bond shown in FIG. 10.

There has been shown and described a semiconductor device having an improved bond pad wherein openings are formed in the bond pad to help create a more robust bond between the bond pad and an electrode. The particular embodiments shown in the drawings and described herein are for purposes of example and should not be construed to limit the invention as set forth in the appended claims.

I claim:

1. A semiconductor device having an improved bond pad, the semiconductor device comprising:

a. a bond pad electrically connected to an active circuit in the semiconductor device;

b. a substantially flat bonding surface on the bond pad; and c. an opening extending partially into the bonding surface.

2. A semiconductor device according to claim 1, further comprising a plurality of openings in the bonding surface of the bond pad.

3. A semiconductor device according to claim 2, wherein the openings are disposed about a center portion of the bonding surface of the bond pad so that the center portion of the bonding surface is free of openings.

4. A semiconductor device according to claim 4, wherein the openings comprise a pattern of radiating channels disposed about a center of the bonding surface.

5. A semiconductor device according to claim 2, wherein the openings comprise a series of spaced apart rectangular channels arranged parallel to one another.

6. A semiconductor device according to claim 2, wherein the openings comprise an array of L shaped channels disposed about a center of the bonding surface.

7. A semiconductor device according to claim 2, wherein the openings comprise an array of holes disposed about the bonding surface.

8. A semiconductor device, which comprises:

a. an active circuit in the semiconductor device;

b. a wiring pattern overlying and in electrical contact with the active circuit;

c. bond pads formed as select areas on the wiring pattern; and d. a plurality of openings extending partially into a substantially flat bonding surface of the bond pads.

9. A semiconductor device according to claim 8, wherein the openings are disposed about a center portion of the bonding surface of the bond pad so that the center portion of the bonding surface is free of openings.

10. A semiconductor device according to claim 8, wherein the openings comprise a pattern of radiating channels disposed about a center of the bonding surface.

11. A semiconductor device according to claim 8, wherein the openings comprise a series of spaced apart rectangular channels arranged parallel to one another.

12. A semiconductor device according to claim 8, wherein the openings comprise an array of L shaped channels disposed about a center of the bonding surface.

13. A semiconductor device according to claim 8, wherein the openings comprise an array of holes disposed about the bonding surface.

14. A semiconductor device according to claim 8, further comprising a passivation layer overlying the wiring pattern, the passivation layer having holes therethrough to expose the bonding surface of the bond pads to enable electrical connection to the bond pads through the holes.

15. A semiconductor device according to claim 8, further comprising bond wires bonded to the bonding surface of the bond pads.

16. A semiconductor device, comprising:

a. a layer of insulating material;

b. a substantially flat layer of conductive material overlying the layer of insulating material;

c. bond pads formed as select areas on a surface of the layer of conductive material; and d. at least one opening extending partially into the bond pads.

* * * * *